US005101133A

United States Patent [19]

Schäfer

[11] Patent Number: 5,101,133

[45] Date of Patent: Mar. 31, 1992

[54] ULTRASONIC TRANSDUCER HAVING PIEZOELECTRIC TRANSDUCER ELEMENTS

[75] Inventor: Dagobert Schäfer, Bretten, Fed. Rep. of Germany

[73] Assignee: Richard Wolf GmbH, Knittlingen, Fed. Rep. of Germany

[21] Appl. No.: 619,353

[22] Filed: Nov. 27, 1990

[30] Foreign Application Priority Data

Jan. 9, 1990 [DE] Fed. Rep. of Germany ....... 4000362

[51] Int. Cl.[5] ........................................ H01L 41/08

[52] U.S. Cl. ........................................ 310/335; 310/365; 310/366; 310/334

[58] Field of Search ........ 310/363, 365, 366, 334–337, 310/358, 359

[56] References Cited

U.S. PATENT DOCUMENTS

| | | | |
|---|---|---|---|
| 4,183,007 | 1/1980 | Baird | 367/119 |
| 4,217,684 | 8/1980 | Brisken et al. | 310/334 X |
| 4,460,841 | 7/1984 | Smith et al. | 310/334 |
| 4,526,168 | 7/1985 | Hassler et al. | 128/303 R |
| 4,551,647 | 11/1985 | Day | 310/335 |
| 4,604,543 | 8/1986 | Umemura et al. | 310/334 |
| 4,608,507 | 8/1986 | Neubauer et al. | 310/335 |
| 4,692,654 | 9/1987 | Umemura et al. | 310/334 |
| 4,721,106 | 1/1988 | Kurtze et al. | 128/328 |
| 4,782,469 | 11/1988 | Granz et al. | 367/157 |
| 4,803,392 | 2/1989 | Kushida et al. | 310/366 X |

FOREIGN PATENT DOCUMENTS 3545353 6/1987 Fed. Rep. of Germany .

*Primary Examiner*—Mark O. Budd
*Attorney, Agent, or Firm*—Panitch Schwarze Jacobs & Nadel

[57] ABSTRACT

An ultrasonic transducer for lithotripsy has piezoelectric transducer elements fixed to a backing and connected on the front side to first electrodes and on the rear side to second electrodes which can be connected to an electrical pulse generator. In order to avoid the danger of tissue damage in the focal area, especially for focusing transducers, the electrodes are designed such that an homogeneous field is produced in the front-side part of the transducer elements and a non-homogeneous field is produced in the opposite, rear-side part of the transducer elements. The amplitude of the negative pulse occurring in addition to the positive pressure pulse is thus reduced, the negative pulse being responsible for the danger of this tissue damage. In one way of achieving this effect each transducer element is provided with a pot-shaped electrode which surrounds the rear-side part of the transducer element.

7 Claims, 4 Drawing Sheets

PRIOR ART

ULTRASONIC TRANSDUCER HAVING PIEZOELECTRIC TRANSDUCER ELEMENTS

BACKGROUND OF THE INVENTION a) Field of the Invention

The invention relates to an ultrasonic transducer for lithotripsy in which piezoelectric transducer elements are fixed to a backing and are connected on their front side to first electrodes and their rear side to second electrodes which can be connected to an electric pulse generator to produce electric fields by means of pulses in the transducer elements via the electrodes and to oscillate the transducer elements.

b) Description of the Prior Art

Ultrasonic transducers designed in this way are known. The way in which they work is based on producing a mechanical state of stress suddenly in the interior of the piezoelectric transducer element when a voltage is applied, which mechanical state of stress is produced by setting up an electric field in the interior of the transducer element which has the effect of each layer of the transducer element trying to change its thickness. When the electrodes of the ceramic body in the transducer elements are plane parallel, a homogeneous, electric field is thus produced in the interior thereof which also produces pressure pulses of negative sign in addition to positive pulses in transducer elements fixed to a reflection-free rear-side backing. These occur as pulse trains which bring with them the danger of tissue damage in the focal area, especially with the conventional focusing transducers.

Various measures which have the aim of reducing the amplitude of the negative pulse waves emitted, have been taken to minimise this danger.

Hence a piezoelectric transducer can be seen from German Patentschrift 3 425 992 in which a number of transducer elements are arranged on the front side of a spherical cup-shaped backing. The cup material is thus selected so that its wave resistance hardly differs from that of the ceramic elements and the rear side of the surface of the cup is shaped so that the sound waves produced by the ceramic elements and reflected on the cup are not focused. Hence a favourable ratio of the amplitudes of the positive and negative pulses can indeed be achieved. However, further required reduction of the negative pulses cannot be achieved as their shape is predetermined at the border layer transducer element-backing by the existing geometry of the transducer elements and the arrangement of the electrodes.

German Offenlegungsschrift 3 119 295 shows a further device for destroying concrements in which the danger of tissue damage is reduced by the ultrasonic transducer to be focused on the concrement having such a large surface area that, on the one hand the sound intensity is low on the transmission path, but on the other hand is so large at the focus that it is sufficient to destroy the concrement situated at the focus.

It is therefore the main object of the invention to provide an ultrasound tranducer having a high sound intensity at the focus and in which the negative pressure pulse is reduced so far that any danger of tissue damage in the area of the concrement and on the transmission path is avoided.

SUMMARY OF THE INVENTION

To this end, the present invention consists in an ultrasonic transducer for lithotripsy in which piezoelectric transducer elements are fixed to a backing and are connected on the front side to first electrodes and on the rear side to second electrodes which can be connected to an electric pulse generator to produce electric fields by means of pulses in the transducer elements via the electrodes and to oscillate the transducer elements, characterised in that the electrodes are designed and arranged such that an homogeneous field can be produced in the region of one end of the transducer elements and a non-homogeneous field in the opposite region of the tranducer elements.

This may be achieved by the second electrodes having a shape differing at least partly from the first electrodes and advantageously and more specifically by the second electrodes having a pot-shape each completely surrounding one region of the transducer elements.

The amplitude of the positive pressure pulse increases due to this measure, while that of the negative pressure pulse is reduced at the same time and its duration in terms of time is lengthened. The behaviour is thus the opposite when the positive and negative pressure pulses are produced, the duration multiplied by the square of the amplitude being a measure of the energy density contained in the particular pressure pulse.

According to a preferred embodiment, the base of the pot-shaped second electrodes may extend parallel to the first electrodes. However, the second electrodes may also have the shape of rings which lie on the same axis as the transducer elements assigned to them and each encloses the rear-side part of the transducer elements.

Electrical connection may thus be made on the rear side by the rear-side end faces of the transducer elements and the rings being connected in an electrically conducting manner to the likewise conducting backing. A further possibility for the rear-side electrical connection resides in the second electrodes being formed by recesses in the electrically conducting backing, and in the rear-side parts of the electrodes being fixed in the recesses. The electrical connection of the transducer elements on the front side may be produced by covering the front-side ends of the transducer elements together with an electric conductor forming the first electrodes.

BRIEF DESCRIPTION OF THE DRAWINGS

In order that the invention may be more readily understood, some embodiments thereof will now be described, by way of example, with reference to the accompanying drawings in which.

DESCRIPTION OF THE PREFERRED EMBODIMENTS

Figure 1:
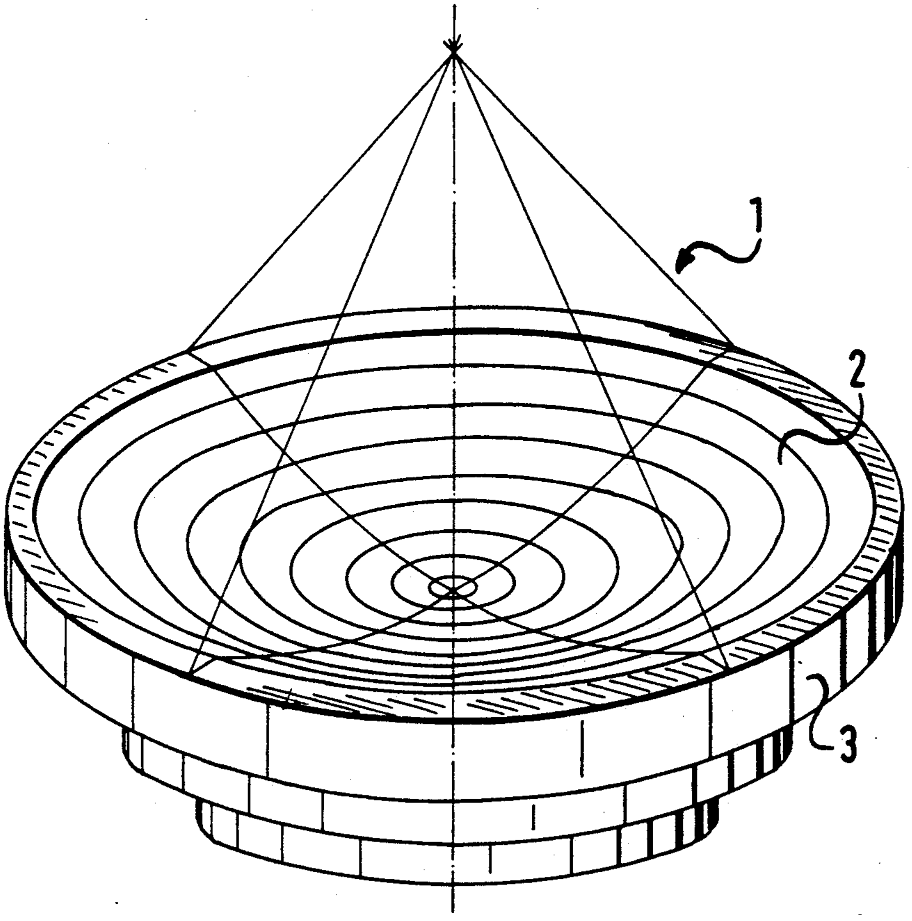
FIG. 1 shows a focusing ultrasonic tranducer of known construction.

FIG. 1 shows a focusing ultrasonic transducer 1 which has a number of piezoelectric ultrasonic transducer elements 2 in a ring arrangement about the central axis. The ultrasonic transducer 1 has a spherical cup shape and is thus mechanically focused, and furthermore may be electrically focused in known manner and therefore will not be described in more detail.

Figure 2:
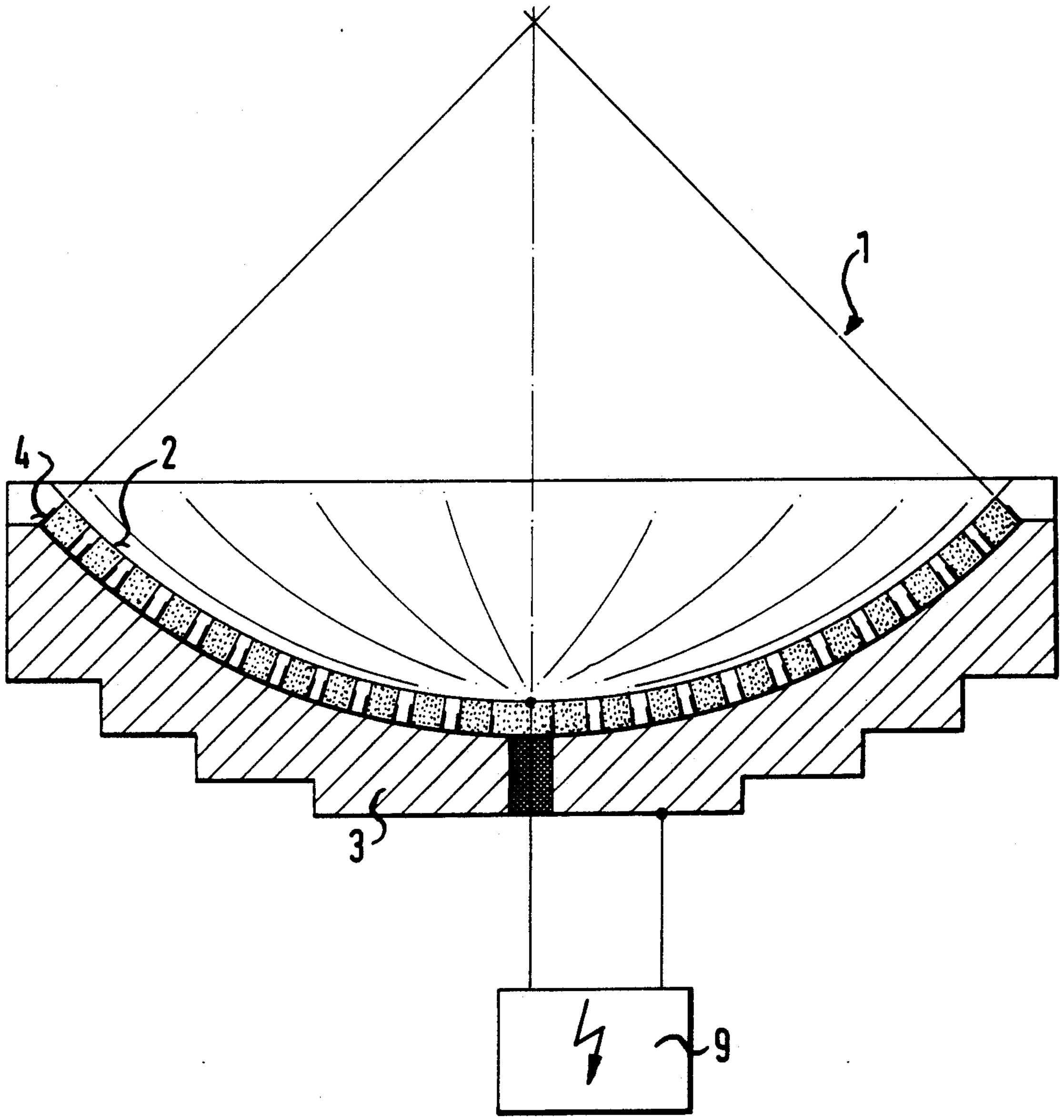
FIG. 2 shows a cross-section through the ultrasonic transducer according to FIG. 1 but with electrodes on a backing side having a design according to the invention.
Figure 3:
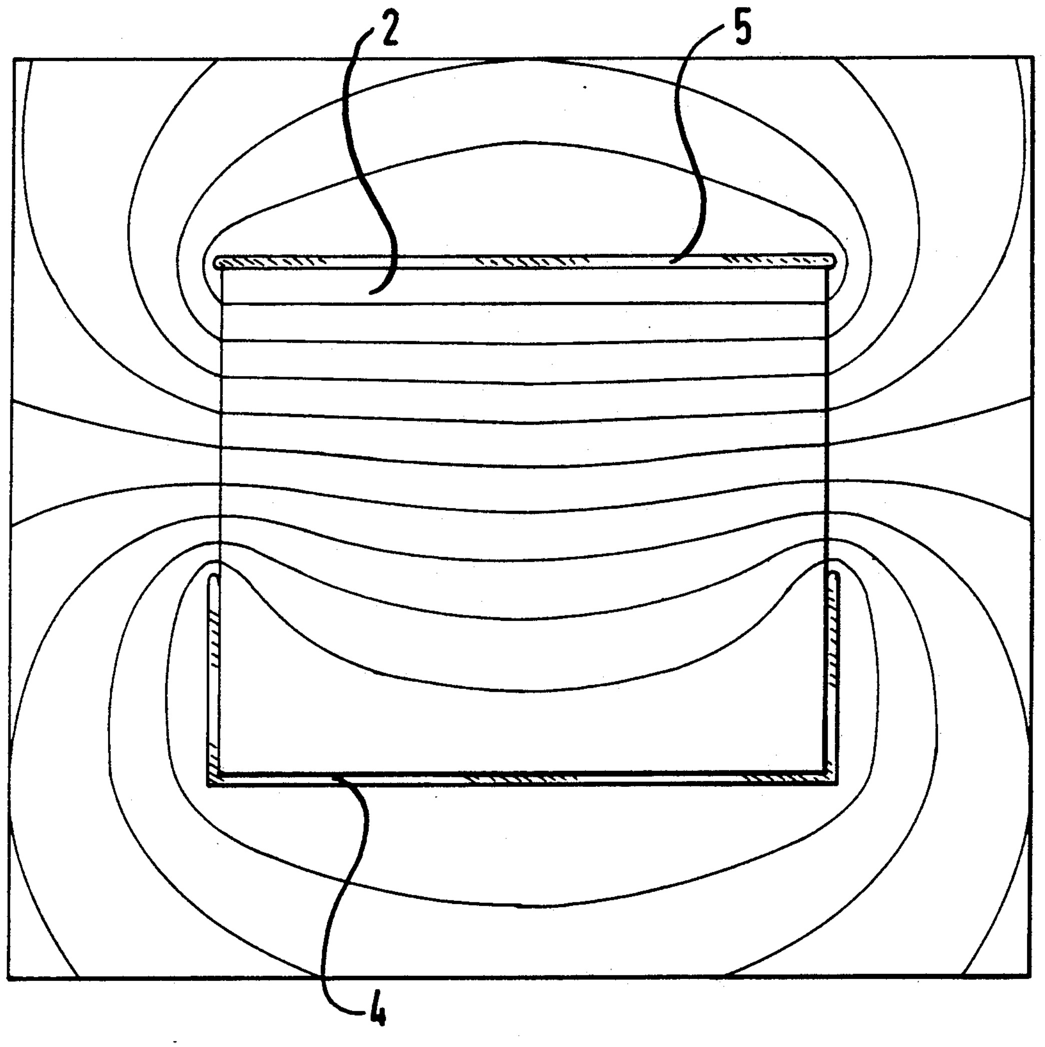
FIG. 3 shows an enlarged schematic section of a transducer element of the invention with the electric field produced in the latter after applying a voltage.

According to FIG. 2 the rear-side ends of the transducer elements 2 are fixed, preferably by adhesion, to an electrically conductive backing 3 which has a cup-shaped structure. Each transducer element 2 is enclosed, at its rearside end, by a pot-shaped electrode 4, as can be seen more clearly in FIG. 3, so that the pot-shaped electrode 4 forms the contact with the electrically conductive backing 3. This contact is secured by using an adhesive which likewise is electrically conducting. The pot-shaped design of the electrode 4 ensures that not only the flat end face of the transformer elements 2 is connected in an electrically conducting manner, but also parts of the lateral limiting surfaces of the same. This circumstance ensures that when a voltage is applied between a front-side electrode 5 and the rear-side, pot-shaped electrodes 4, an electric field is set up, as shown in FIG. 3, by its equipotential lines, which is homogeneous on the front side and non-homogeneous on the rear side in the transducer elements 2, as distortion takes place here as a result of the pot shape of the electrode 4. To achieve this desired effect it is a prerequisite that the rear side, non-homogeneous electric field does not influence or only slightly influences the front side, homogeneous field, and this is ensured if the diameter of the transducer element 2 does not signficiantly exceed its height. The front side electrode 5 may be provided in the form of an electrically conductive film with which the front-side end faces of the transducer elements 2 are connected.

Figure 4:
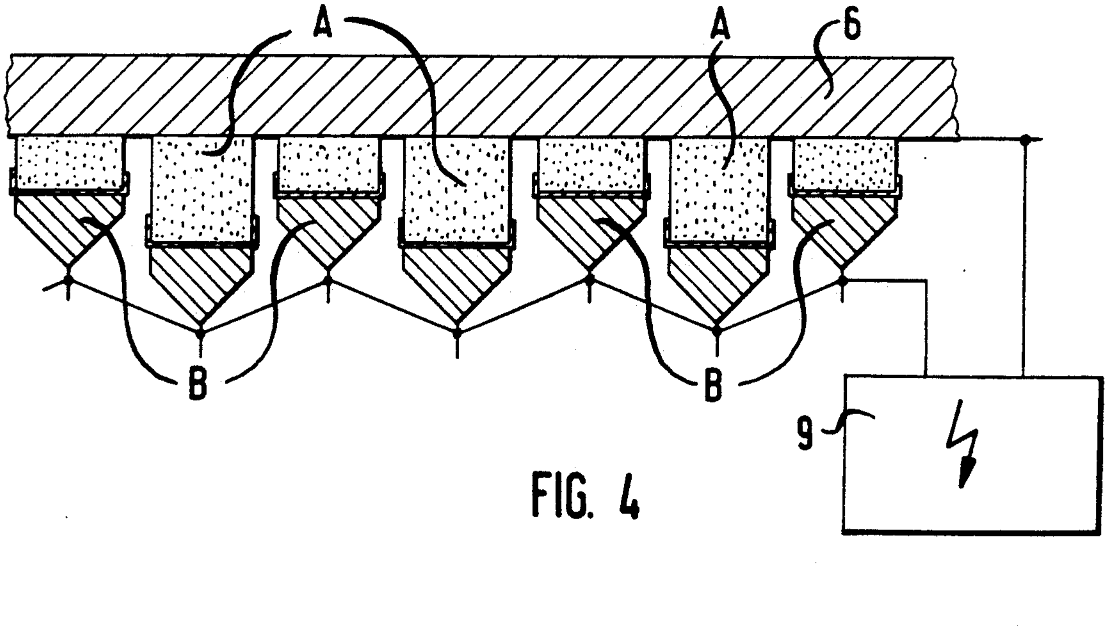
FIG. 4 shows a variation of the design of the electrodes for electrical connection of the transducer elements.

The construction of the ultrasonic transducer 1 according to FIG. 4 allows the front-side end faces of the transducer elements 2 to be fixed to a plate 6 which is electrically conducting and which conducts the sound energy. The rear-side, pot-shaped electrodes 4 attached to the transducer elements 2 are connected to one another individually in an electrically conducting manner.

Figure 5:
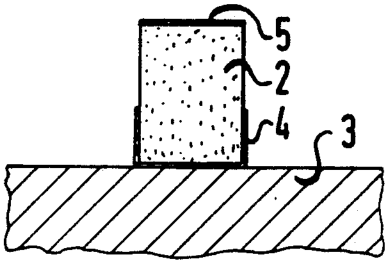
FIGS. 5,6 and 7 show various embodiments of the invention for the rear-side electrodes.

Referring to FIG. 5, the rear-side ends of the transducer elements 2 enclosed by pot-shaped electrodes 4 and shaped in accordance with the invention are fixed to a flat backing surface.

Figure 6:
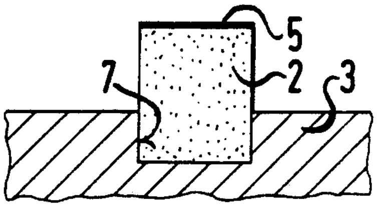
Figure 7:
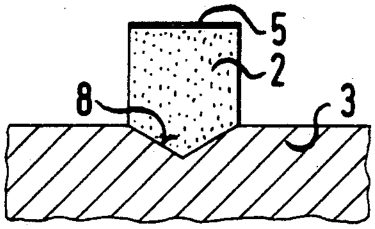

According to FIG. 6, elements 2 are each fitted into a respective recess 7 in the backing 3 and this gives the pot shape or forms the pot-shape of the rear side electrode. In FIG. 7 a cone-shaped recess 8 which gives the pot-shape to or forms the rear-side electrode is provided which likewise effects non-homogeneity of the electric field in the region of the rear-side end of the transducer element 2.

The transducer elements 2 are subjected to electrical pulses in known manner by means of a pulse generator 9, the poles of which are connected on one side to the backing 3, and on the other side to the conductive film connecting the front end faces of the transducer elements 2.

Although particular embodiments have been described, it should be appreciated that the invention is not limited thereto but includes all modifications and variations falling within its scope.

I claim:

1. An ultrasonic transducer for lithotripsy in which a plurality of individual piezoelectric transducer elements are fixed to a backing and are connected on a front side thereof to first electrodes and on a rear side thereof to second electrodes which are connected too an electric pulse generator to produce electric fields by means of pulses in the transducer elements via the electrodes and too oscillate the transducer elements, characterised in that said second electrodes have a pot-shape which surrounds and is electrically connected to the rear side of each respective element and part of said pot-shaped second electrode extends along and is electrically connected to a portion of the side walls of each respective element adjacent to the rear side thereof, so that an homogeneous field is produced in the region of said first electrodes and a non-homogeneous field is produced in the region of said second electrodes.

2. An ultrasonic transducer according to claim 1 wherein said part of said second electrodes which extends along a portion of the side walls extends from the rear side to an extent of distance less than half o the total distance between the rear side and the front side of the respective elements.

3. An ultrasonic transducer according to claim 1, wherein the pot-shaped second electrodes have a base which extennds parallel to the first electrode.

4. A ultrasonnic transducer according to claim 1, wherein the second electrodes are designed as rings which lie on the same axis as the trannsducer elements assigned to them and each encloses a rear-side part of the transducer elements.

5. An ultrasonic transducer according to claim 4, wherein the transducer elements have rear-side end faces and wherein the rear-side end faces of the transducer elements and the rings are connected in an electrically conducting manner to a likewise conducting backing.

6. An ultrasonic transducer according to claim 1, wherein the second electrodes are formed by recesses in an electrically conducting backing and wherein the transducer elements have rear-side parts which are fixed in the recesses.

7. An ultrasonic transducer according to claim 1, wherein the transducer elements have front side ends which are covered together with an electric conductor forming the first electrodes.

* * * * *